(12) United States Patent
Park

(10) Patent No.: US 6,947,343 B2
(45) Date of Patent: Sep. 20, 2005

(54) SEMICONDUCTOR MEMORY DEVICE (75) Inventor: In-Gyu Park, Yangsan (KR)

(73) Assignee: Samsung Electronics Co., Ltd., Suwon-si (KR)

(*) Notice: Subject to any disclaimer, the term of this patent is extended or adjusted under 35 U.S.C. 154(b) by 30 days.

(21) Appl. No.: 10/780,925

(22) Filed: Feb. 19, 2004

(65) Prior Publication Data
US 2004/0165460 A1 Aug. 26, 2004

(30) Foreign Application Priority Data

Feb. 24, 2003 (KR) .............................. 10-2003-0011492

(51) Int. Cl.[7] .................................................. G11C 7/00
(52) U.S. Cl. .................. 365/203; 365/198; 365/230.03
(58) Field of Search ........................... 365/230, 189.01, 365/198, 230.03

(56) References Cited

U.S. PATENT DOCUMENTS 5,844,849 A * 12/1998 Furutani ..................... 365/194
5,864,511 A * 1/1999 Sato ........................... 365/203
6,172,918 B1 * 1/2001 Hidaka ................... 365/189.11

* cited by examiner

Primary Examiner—Anh Phung
Assistant Examiner—Toan Le
(74) Attorney, Agent, or Firm—Volentine Francos & Whitt, PLLC (57) ABSTRACT Each memory block of a memory device a plurality of memory cells connected to a plurality of bit line pairs, a column selecting circuit, and a pre-charge and write control circuit. The column selecting circuit includes a plurality of CMOS transmission gates, each CMOS transmission gate including an NMOS transistor connected between one bit line of a bit line pair and a sense bit line of a sense bit line pair, and a PMOS transistor connected between the one bit line and one of the write bit lines of a write bit line pair. During a write operation, only the NMOS transistor of a selected one of the CMOS transmission gates is turned on, and the PMOS transistor of the selected CMOS transmission gate and the PMOS and NMOS transistors of all of the CMOS transmission gates except the selected one are all turned off.

11 Claims, 7 Drawing Sheets

SEMICONDUCTOR MEMORY DEVICE

CROSS REFERENCES TO RELATED APPLICATIONS

This patent application claims priority under 35 U.S.C. § 119 of Korean Patent Application 2003-11492 filed on Feb. 24, 2003, the entire contents of which are hereby incorporated by reference for all purposes as if fully set forth herein.

BACKGROUND AND SUMMARY

1. Technical Field

The present invention relates to a semiconductor memory device, more particularly to a semiconductor memory device which is built in a system-on-chip (SOC).

2. Description

Operation of a semiconductor memory device built in a conventional system-on-chip (SOC) includes a pre-charge operation, a write operation, and a read operation. The pre-charge operation pre-charges bit line pairs and sense bit line pairs to a pre-charge voltage level before a write operation and a read operation in response to a pre-charge enable signal. The write operation writes write data to selected memory cells through write bit line pairs and bit line pairs in response to a write enable signal. The read operation reads data stored in the selected memory cells through bit line pairs and sense bit line pairs in response to a read enable signal.

A column selecting circuit of the conventional semiconductor memory device includes a PMOS transistor and an NMOS transistor which are connected to bit lines and inverted bit lines. For the read operation, the PMOS transistors connected between the bit line pairs and the sense bit line pairs are turned on, thereby reading data stored in the selected memory cells through bit line pairs and sense bit line pairs. For the write operation, the NMOS transistors connected between bit line pairs and write bit line pairs as well as the PMOS transistors connected between bit line pairs and sense bit line pairs are turned on, thereby writing write data to selected memory cells through write bit line pairs and bit line pairs.

Therefore, since both PMOS transistors and NMOS transistors including the column selecting circuit are turned on for the write operation, even sense bit line pairs as well as write bit line pairs and bit line pairs operate. Hence, the conventional semiconductor memory device has a problem in that power consumption increases during a write operation.

It is an object of the present invention to provide a semiconductor memory device which can reduce power consumption during a write operation.

In accordance with one aspect of the present invention, a semiconductor memory device includes a plurality of memory cell array blocks including a plurality of memory cells connected between a plurality of word lines and a plurality of bit line pairs, each of the memory cell array blocks including a column selecting circuit having a plurality of first transmission transistors for transmitting data between the selecting bit line pair among the plurality of the bit line pairs and a write bit line pair in response to a plurality of write control signals, and a plurality of second transmission transistors for transmitting data between the selected bit line pair and a sense bit line pair in response to a plurality of read control signals; and a pre-charge and write control circuit for pre-charging and equalizing the sense bit line pair in response to a pre-charge enable signal during a pre-charge operation, generating the plurality of the read control signals in response to a write enable signal and a plurality of column selecting signals during a read operation, and generating the plurality of write control signals in response to a block selecting signal, the write enable signal, the pre-charge enable signal, and the plurality of the column selecting signals during a write operation.

The pre-charge and write control circuit includes a pre-charge and equalizing circuit for pre-charging and equalizing the sense bit line pair in response to the pre-charge enable signal; a write control signal generating circuit for generating a write control signal by combining the block selecting signal, the write enable signal and the pre-charge enable signal; a read control signal generating circuit for generating the plurality of the read control signals by combining the plurality of the column selecting signals and the write enable signal; and a write control signal generating circuit for generating the plurality of the write control signals by combining the plurality of the column selecting signals and the write control signal, wherein all of the plurality of the first and the second transmission transistors are turned off during a pre-charge operation, and the selected first transmission transistors among the plurality of the first and the second transmission transistors are turned on during a write operation.

In accordance with another aspect of the present invention, a semiconductor memory device includes a plurality of memory cell array blocks including a plurality of memory cells connected between a plurality of word lines and a plurality of bit line pairs, each of the memory cell array blocks including a column selecting circuit having a plurality of first transmission transistors for transmitting data between the selecting bit line pair among the plurality of the bit line pairs and a write bit line pair in response to a plurality of write control signals, and a plurality of second transmission transistors for transmitting data between the selected bit line pair and a sense bit line pair in response to a plurality of read control signals; and a pre-charge and write control circuit for equalizing the sense bit line pair in response to a pre-charge enable signal during a pre-charge operation, generating the plurality of the read control signals in response to a write enable signal, the pre-charge enable signal and a plurality of column selecting signals during a read operation, and generating the plurality of write control signals in response to a block selecting signal, the write enable signal, the pre-charge enable signal, and the plurality of the column selecting signals during a write operation.

The pre-charge and write control circuit includes an equalizing circuit for equalizing the sense bit line pair in response to the pre-charge enable signal; a write control signal generating circuit for generating a write control signal by combining the block selecting signal, the write enable signal and the pre-charge enable signal; a read control signal generating circuit for generating the plurality of the read control signals by combining the plurality of the column selecting signals, the write enable signal and the pre-charge enable signal; and a write control signal generating circuit for generating the plurality of the write control signals by combining the plurality of the column selecting signals and the write control signal, wherein the plurality of the second transmission transistors are turned on during a pre-charge operation, and the selected first transmission transistors among the plurality of the first and the second transmission transistors are turned on during a write operation.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION

Reference will now be made in detail to preferred embodiments of the present invention, examples of which are illustrated in the accompanying drawings.

Figure 1:
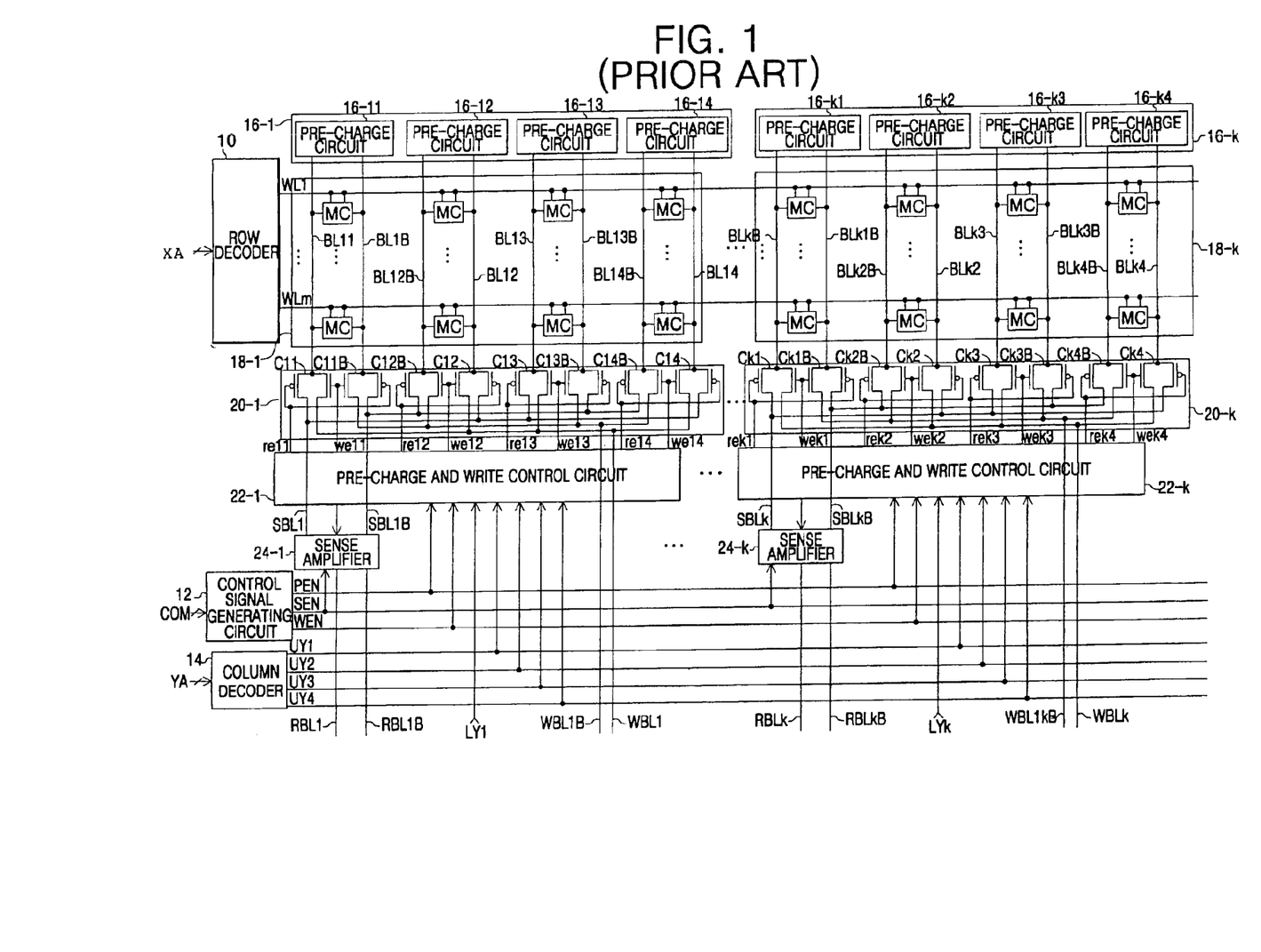
FIG. 1 is a block diagram illustrating a conventional semiconductor memory device.

FIG. 1 is a block diagram illustrating a conventional semiconductor memory device. The semiconductor memory device of FIG. 1 includes a row decoder 10, a control signal generating circuit 12, a column decoder 14, and a plurality (k) of memory blocks. Each memory block includes a pre-charge circuit 16, a memory cell array block 18, a column selecting circuit 20, a pre-charge and write control circuit 22, and a sense amplifier 24. Thus, the semiconductor memory device of FIG. 1 includes pre-charge circuits 16-1 to 16-k, memory cell array blocks 18-1 to 18-k, column selecting circuits 20-1 to 20-k, pre-charge and write control circuits 22-1 to 22-k, and sense amplifiers 24-1 to 24-k.

In FIG. 1, each of the pre-charge circuits 16-1 to 16-k includes pre-charge circuits (16-11~16-14) to (16-k1~16-k4) for pre-charging bit line pairs (BL11,BL11B)~(BL14, BL14B) to (BLk1,BLk1B)~(BLk4,BLk4B). Each of the memory cell array blocks 18-1 to 18-k includes memory cells MC connected between word lines WL1 to WLm and the bit line pairs (BL11,BL11B)~(BL14,BL14B) to (BLk1, BLk1B)~(BLk4,BLk4B). Each of the column selecting circuits 20-1 to 20-k includes CMOS transmission gates (C11, C11B)~(C14B,C14) to (Ckl,Ck1B)~(Ck4B,Ck4) which includes NMOS transistors connected between the bit line pairs (BL11,BL11B)~(BL14,BL14B) to (BLk1,BLk1B)~ (BLk4,BLk4B) and write bit line pair (WBL1,WBL1B) and PMOS transistors connected between the bit line pairs (BL11,BL11B)~(BL14,BL14B) to (BLk1,BLk1B)~(BLk4, BLk4B) and sense bit line pair (SBL1,SBL1B). In the CMOS transmission gates (C11,C11B)~(C14B,C14) to (Ck1,Ck1B)~(Ck4B,Ck4), the PMOS transistors are turned on in response to respective read control signals (re11~re14) to (rek1~rek4), and the NMOS transistors are turned on in response to respective write control signals (we11~we14) to (wek1~wek4).

Function of components of the semiconductor memory device of FIG. 1 is explained below.

The row decoder 10 decodes a row address XA to generate word line selecting signals WL1 to WLm. The control signal generating circuit 12 receives a command signal COM to generate a pre-charge enable signal PEN, a sense amplifier enable signal SEN, and a write enable signal WEN. The column decoder 14 decodes a 2-bit column address YA to generate column selecting signals UY1 to UY4. Each of the pre-charge circuits (16-11~16-14) to (16-k1~16-k4) pre-charges the bit line pairs (BL11,BL11B) ~(BL14,BL14B) to (BLk1,BLk1B)~(BLk4,BLk4B) to a pre-charge voltage level in response to a pre-charge enable signal PEN during a pre-charge operation. Each of the PMOS transistors of each of the CMOS transmission gates (C11,C11B)~(C14B,C14) to (Ck1,Ck1B)~(Ck4B,Ck4) are turned on in response to respective read control signals (re11~re14) to (rek1~rek4) to transmit data of the bit line pairs (BL11,BL11B)~(BL14,BL14B) to (BLk1,BLk1B)~ (BLk4,BLk4B) to the respective sense bit line pair (SBL1, SBL1B) to (SBLk,SBLkB) during the read operation. Each of the NMOS transistors of each of the CMOS transmission gates (C11,C11B)~(C14B,C14) to (Ckl,Ck1B)~(Ck4B,Ck4) are turned on in response to the respective write control signals (we11~we14) to (wek1~wek4) to transmit data of the respective write bit line pairs (WBL1,WBL1B) to the respective bit line pairs (BL11,BL11B)~(BL14,BL14B) to (BLk1,BLk1B)~(BLk4,BLk4B) during the write operation. Each of the sense amplifiers 24-1 to 24-k is turned on in response to the sense amplifier enable signal SEN to amplify a signal difference of each of the sense bit line pairs (SBL1,SBL1B) to (SBLk,SBLkB) and then to transmit them to read bit line pairs (RBL1,RBL1B) to (RBLk,RBLkB), respectively. Each of the pre-charge and write control circuit 22-1 to 22-k generates a pre-charge control signal (see FIG. 2) in response to the pre-charge enable signal PEN, generates the write control signals (we11~we14) to (wek1~wek4) in response to the write enable signal WEN and block selecting signals LY1 to LYk, and generates the read control signals (re11~re14) to (rek1~rek4) in response to column selecting signals (UY11~UY14) to (UYk1~UYk4). During the pre-charge operation, the PMOS transistors of the CMOS transmission gates (C11,C11B)~(C14B,C14) to (Ck1,Ck1B)~(Ck4B,Ck4) are turned on in response to the read control signals (re11~re14) to (rek1~rek4) to pre-charge the bit line pairs (BL11,BL11B)~(BL14,BL14B) to (BLk1,BLk1B)~(BLk4,BLk4B) and the sense bit line pairs (SBL1,SBL1B) to (SBLk,SBLkB) to a pre-charge voltage level, and equalize the sense bit line pairs (SBL1,SBL1B) to (SBLk,SBLkB) in response to a pre-charge control signal. During the read operation, the PMOS transistors of the CMOS transmission gates selected among the CMOS transmission gates (C11,C11B)~(C14B,C14) to (Ckl,Ck1B)~ (Ck4B,Ck4) are turned on in response to the read control signals (re11~re14) to (rek1~rek4) to transmit data of the selected bit line pairs to the sense bit line pairs (SBL1, SBL1B) to (SBLk,SBLkB). During the write operation, the PMOS transistors and the NMOS transistors of the CMOS transmission gates selected among the CMOS transmission gates (C11,C1B)~(C14B,C14) to (Ckl,Ck1B)~(Ck4B,Ck4) are turned on in response to the read control signals (re11~re14) to (rek1~rek4) to transmit data of the write bit line pairs (WBL1,WBL1B) to (WBLk,WBLkB) to the selected bit line pairs. Here, since the PMOS transistors of the selected CMOS transmission gates are turned on, data which are transmitted to the selected bit line pairs are also transmitted to the sense bit line pairs (SBL1,SBL1B) to (SBLk,SBLkB) through the PMOS transistors.

For the forgoing reason, the conventional semiconductor memory device operates the sense bit line pairs as well as the write bit line pairs and the bit line pairs during the write operation, and thus there is a problem in that power consumption is increased.

Figure 2:
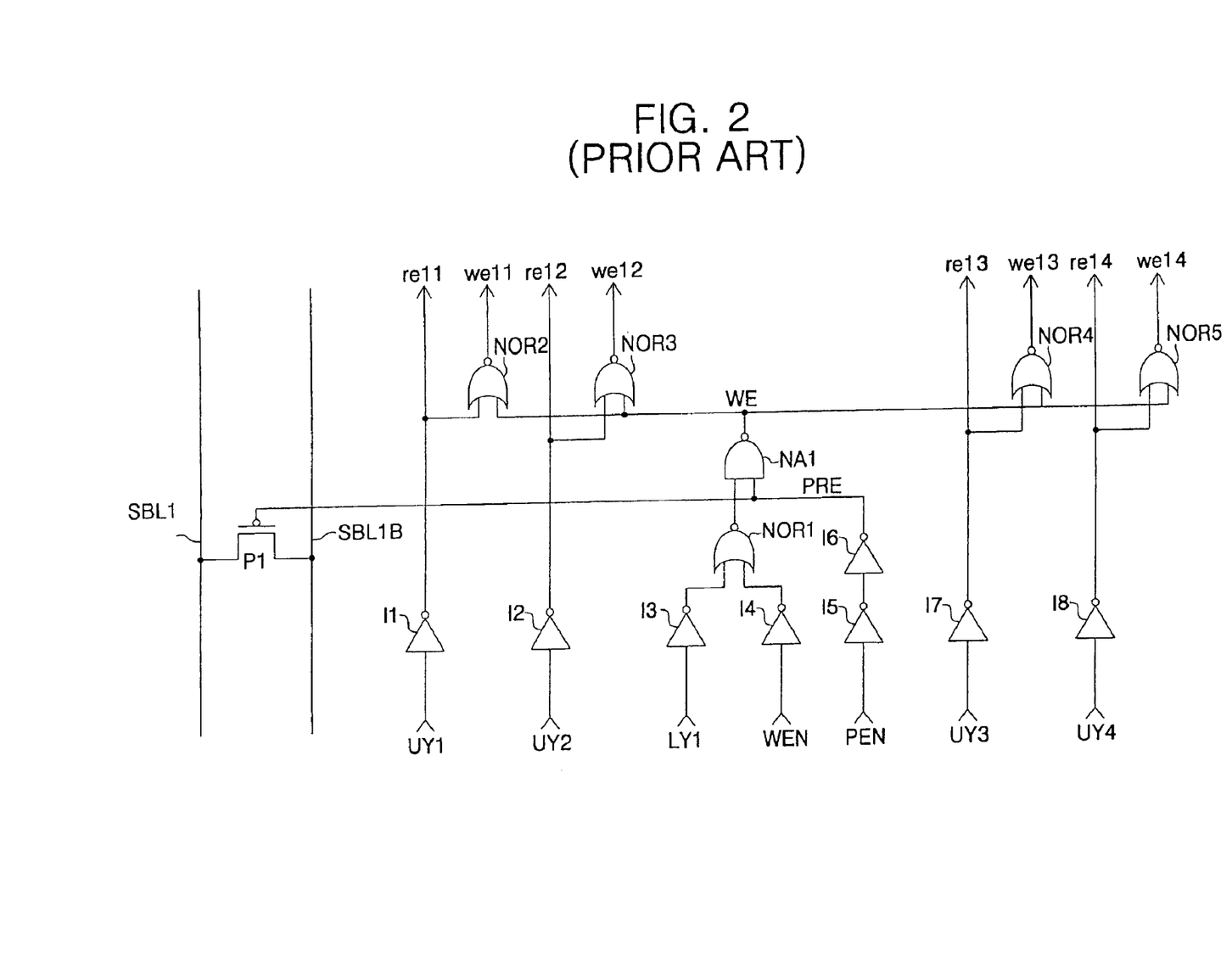
FIG. 2 is a circuit diagram illustrating the pre-charge and write control circuit of the conventional semiconductor memory device of FIG. 1.

FIG. 2 is a circuit diagram illustrating the pre-charge and write control circuit of the conventional semiconductor memory device of FIG. 1. The pre-charge and write control circuit of FIG. 2 includes a PMOS transistor P1, inverters I1 to I8, NOR gates NOR1 to NOR5, and a NAND gate NA.

FIG. 2 shows a configuration of the pre-charge and write control circuit 22-1 of FIG. 1, and the other pre-charge and write control circuits of FIG. 1 have the same configuration as that of FIG. 2.

Figure 3:
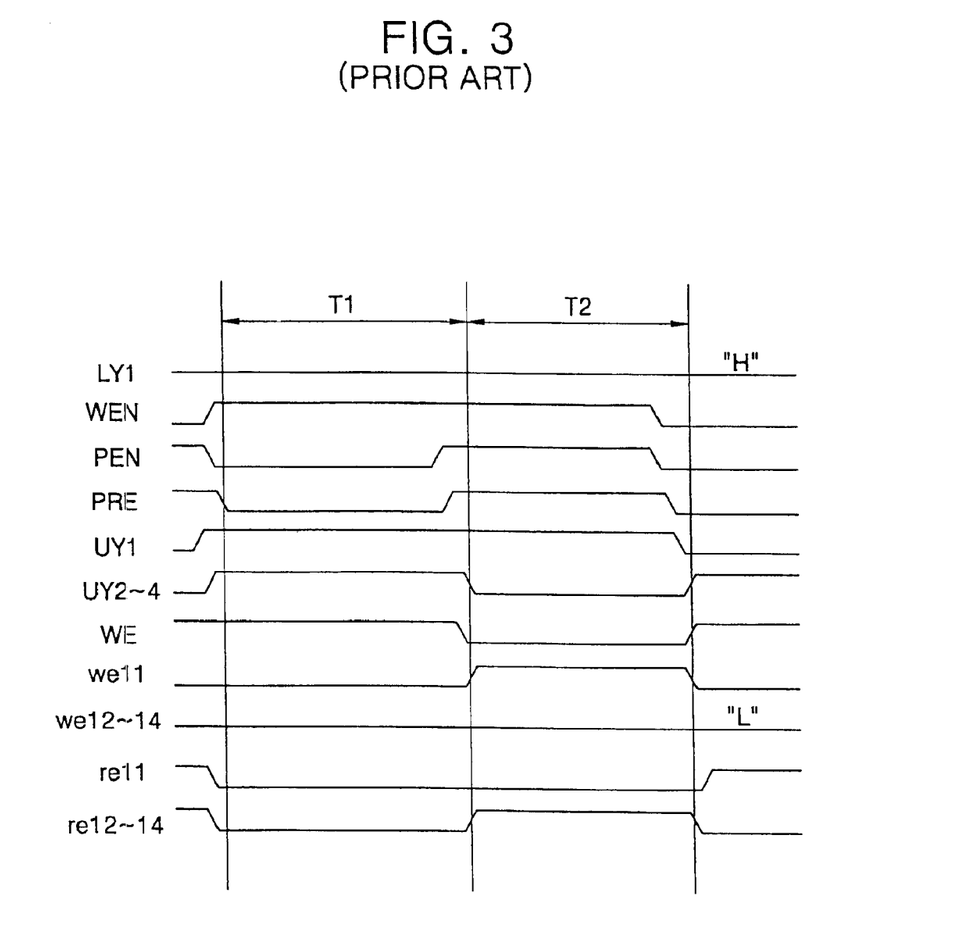
FIG. 3 is a timing diagram illustrating operation of the pre-charge and write control circuit of FIG. 2.

FIG. 3 is a timing diagram illustrating operation of the pre-charge and write control circuit of FIG. 2. Operation of the pre-charge and write control circuit of FIG. 2 is explained with reference to FIG. 3.

During a pre-charge time period T1, when a pre-charge enable signal PEN having a "low" level, a write enable signal WEN having a "high" level, a block selecting signal LY1 having a "high" level, column selecting signals UY1 to UY4 having a "high" level are generated, the inverters I5 and I6 generate a pre-charge control signal PRE having a "low" level. The NOR gate NOR1 generates a signal having a "high" level, and the NAND gate NA1 generates a write signal WE having a "high" level. The inverters I1, I2, I7 and I8 invert the column selecting signals UY1 to UY4 having a "high" level to generate the read control signals re11 to re14 having a "low" level. The NOR gates NOR2 to NOR5 generate the write control signals we11 to we14 having a "low" level.

In other words, during a pre-charge operation, the read control signals re11 to re14 having a "low" level and the write control signals we11 to we14 having a "low" level are generated to turn on the PMOS transistors of the CMOS transmission gates (C11,C11B) to (C14,C14B). As a result, the bit line pairs (BL1,BL11B) to (BL14,BL14B) and the sense bit line pair (SBL1,SBL1B) are pre-charged to a pre-charge voltage level by the pre-charge circuits 16-11 to 16-14 of FIG. 1, and the PMOS transistor P1 is turned on in response to a pre-charge control signal PRE having a "low" level, whereby the sense bit line pair SBL1,SBL1B is equalized. Even though not described, the other memory cell array blocks perform the same function.

During a write time period T2, when a pre-charge enable signal PEN having a "high" level, a write enable signal WEN having a "high" level, a block selecting signal LY1 having a "high" level, a column selecting signal UY1 having a "high" level, and column selecting signals UY2 to UY4 having a "low" level are generated, the inverters I5 and I6 generate a pre-charge control signal PRE having a "high" level, and the PMOS transistor P1 is turned off. The NOR gate NOR1 generates a signal having a "high" level, and the NAND gate NA1 generates a write signal WE having a "low" level. The inverter I1 inverts a column selecting signal UY1 having a "high" level to generate a read control signal re11 having a "low" level, and the inverters I2, I7 and I8 invert the column selecting signals UY2 to UY4 having a "low" level to generate the read control signals re12 to re14 having a "high" level. The NOR gate NOR2 generates a write control signal we11 having a "high" level, and the NOR gates NOR3 to NOR5 generate the write control signals we12 to we14 having a "low" level.

In other words, during a write operation, the read control signal re11 having a "low" level and the write control signal we11 having a "high" level are generated to turn on both the PMOS transistors and the NMOS transistors of the CMOS transmission gates (C11,C11B) of FIG. 1. Also, the read control signals re12 to re14 having a "high" level and the write control signals we12 to we14 having a "low" level are generated to turn off the CMOS transmission gates (C12B, C12) to (C14B,C14) of FIG. 1.

As a result, data transmitted through the write bit line pair (WBL1B,WBL1) are transmitted to the bit line pair (BL11, BL11B) through the NMOS transistors of the CMOS transmission gates (C11,C11B). Here, since the PMOS transistors of the CMOS transmission gates (C11,C11B) are turned on, the data of the bit line pair (BL11,BL11B) are also transmitted to the sense bit line pair (SBL1,SBL1B), thereby increasing power consumption due to operation of the sense bit line pair (SBL1,SBL1B) during the write operation. Even though not described, the other memory cell array blocks perform the same function.

Figure 4:
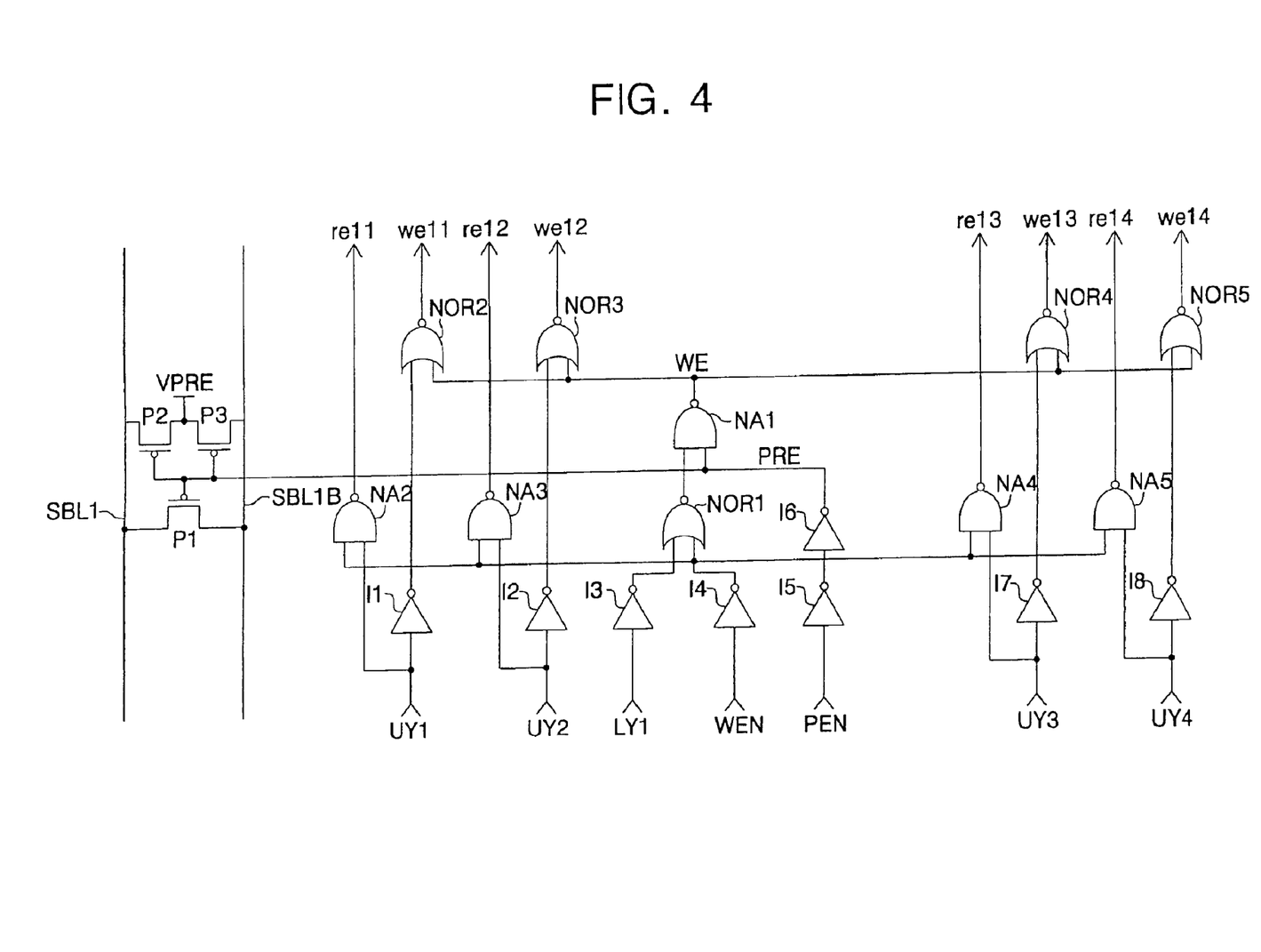
FIG. 4 is a circuit diagram illustrating a pre-charge and write control circuit according to one embodiment.

FIG. 4 is a circuit diagram illustrating a pre-charge and write control circuit according to one embodiment. The pre-charge and write control circuit of FIG. 4 includes PMOS transistors P2 and P3 and NAND gates NA2 to NA5 in addition to a configuration of the pre-charge and write control circuit of FIG. 2.

FIG. 4 shows a configuration of the pre-charge and write control circuit 22-1 of FIG. 1, and the other pre-charge and write control circuits of FIG. 1 have the same configuration as that of FIG. 4.

Figure 5:
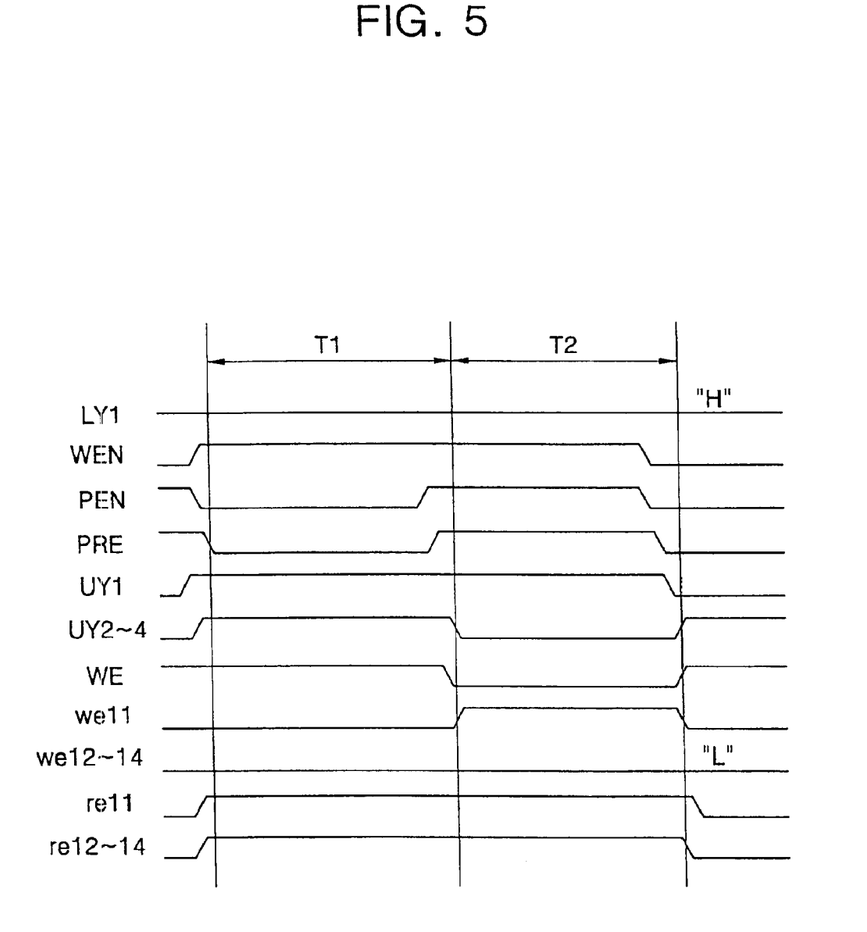
FIG. 5 is a timing diagram illustrating operation of the pre-charge and write control circuit of FIG. 4.

FIG. 5 is a timing diagram illustrating operation of the pre-charge and write control circuit of FIG. 4. Operation of the pre-charge and write control circuit of FIG. 4 is explained with reference to FIG. 5.

During a pre-charge time period T1, when a pre-charge enable signal PEN having a "low" level, a write enable signal WEN having a "high" level, a block selecting signal LY1 having a "high" level, column selecting signals UY1 to UY4 having a "high" level are generated, the inverters I5 and I6 generate a pre-charge control signal PRE having a "low" level, and the PMOS transistors P1 to P3 are turned on. The NOR gate NOR1 generates a signal having a "high" level, and the NAND gate NA1 generates a write signal WE having a "high" level. The inverters I1, I2, I7 and I8 invert the column selecting signals UY1 to UY4 having a "high" level to generate signals having a "low" level. The NAND gates NA2 to NA5 generate read control signals re11 to re14 having a "high" level. The NOR gates NOR2 to NOR5 generate the write control signals we11 to we14 having a "low" level.

In other words, during a pre-charge operation, the read control signals re11 to re14 having a "high" level and the write control signals we11 to we14 having a "low" level are generated to turn off all of the CMOS transmission gates (C11,C11B) to (C14,C14B) of FIG. 1. As a result, the bit line pairs (BL11,BL11B) to (BL14,BL14B) are pre-charged by the pre-charge circuits 16-11 to 16-14 of FIG. 1, and the PMOS transistors P1 to P3 are turned on in response to a pre-charge control signal PRE having a "low" level, whereby the sense bit line pair SBL1,SBL1B is pre-charged and equalized to a pre-charge voltage VPRE level. Even though not described, the other memory cell array blocks perform the same function.

During a write time period T2, when a pre-charge enable signal PEN having a "high" level, a write enable signal WEN having a "high" level, a block selecting signal LY1 having a "high" level, a column selecting signal UY1 having a "high" level, and column selecting signals UY2 to UY4 having a "low" level are generated, the inverters I5 and I6 generate a pre-charge control signal PRE having a "high" level, and the PMOS transistors P1 to P3 are turned off. The NOR gate NOR1 generates a signal having a "high" level, and the NAND gate NA1 generates a write signal WE having a "low" level. The inverter I1 inverts a column selecting signal UY1 having a "high" level to generate a signal having a "low" level, and the inverters I2, I7 and I8 invert the column selecting signals UY2 to UY4 having a "low" level to generate signals having a "high" level, respectively. The NAND gates NA2 to NA5 generate read control signals having a "high" level, and the NOR gate NOR2 generates a write control signal we11 having a "high" level, and the NOR gates NOR3 to NOR5 generate the write control signals we12 to we14 having a "low" level.

In other words, during a write operation, the write control signals we12 to we14 having a "low" level and the read control signals re12 to re14 having a "high" level are generated to turn off the CMOS transmission gates (C12, C12B) to (C14B,C14) of FIG. 1. Meanwhile, a read control signal re11 having a "high" level and a write control signal we11 having a "high" level are generated to turn off the PMOS transistors, but to turn on the NMOS transistors, of the selected pair of CMOS transmission gates (C11,C11B).

As a result, data transmitted through the write bit line pair (WBL1B,WBL1) are transmitted to the bit line pair (BL11, BL11B) through the NMOS transistors of the CMOS transmission gates (C11,C11B). Here, since the PMOS transistors of the CMOS transmission gates (C11,C11B) are turned off, data of the bit line pair (BL1,BL11B) are not transmitted to the sense bit line pair (SBL1,SBL1B). Therefore, a problem such as an increase of power consumption coming from operation of the sense bit line pair (SBL1,SBL1B) during the write operation does not occur.

The pre-charge and write control circuit of FIG. 4 is configured such that all of the CMOS transmission gates are turned off during a pre-charge operation. Meanwhile, during a write operation, only the NMOS transistors of the selected pair of CMOS transmission gates are turned on, and the PMOS transistors of the selected pair of CMOS transmission gates are turned off so that data transmitted to the selected bit line pair may not be transmitted to the sense bit line pair.

Figure 6:
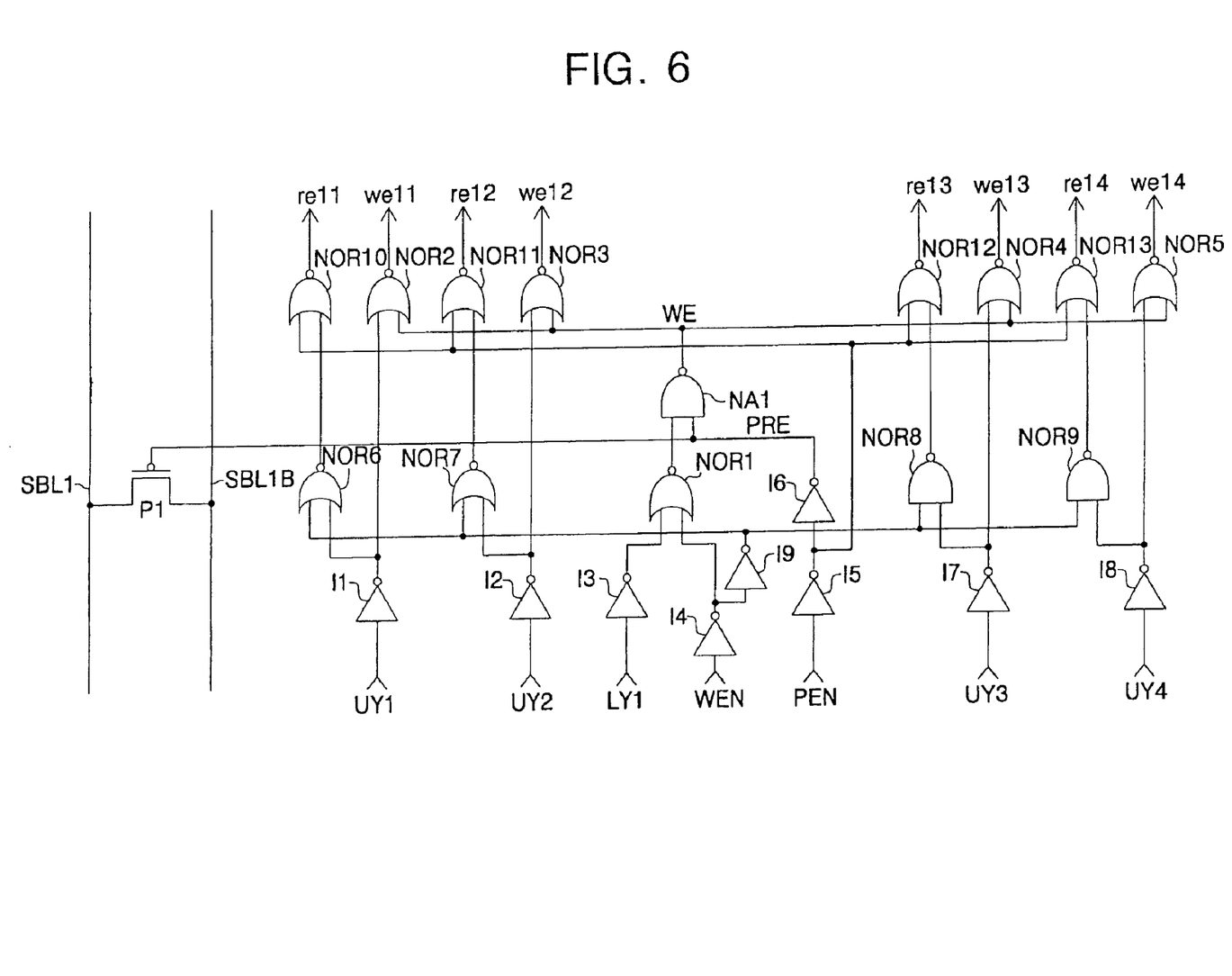
FIG. 6 is a circuit diagram illustrating a pre-charge and write control circuit according to another embodiment.

FIG. 6 is a circuit diagram illustrating a pre-charge and write control circuit according to another embodiment. The pre-charge and write control circuit of FIG. 6 includes an inverter I9 and NOR gates NOR6 to NOR13 in addition to a configuration of the pre-charge and write control circuit of FIG. 2.

FIG. 6 shows a configuration of the pre-charge and write control circuit 22-1 of FIG. 1, and the other pre-charge and write control circuits of FIG. 1 have the same configuration as that of FIG. 6.

Figure 7:
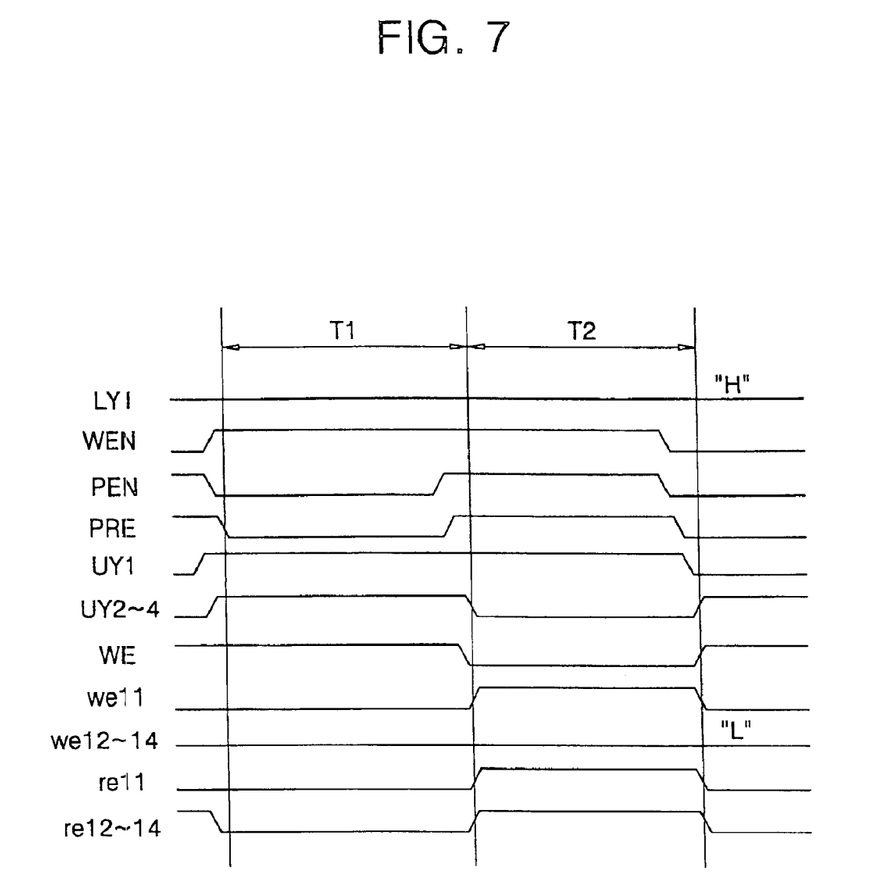
FIG. 7 is a timing diagram illustrating operation of the pre-charge and write control circuit of FIG. 6.

FIG. 7 is a timing diagram illustrating operation of the pre-charge and write control circuit of FIG. 6. Operation of the pre-charge and write control circuit of FIG. 6 is explained with reference to FIG. 7.

During a pre-charge time period T1, when a pre-charge enable signal PEN having a "low" level, a write enable signal WEN having a "high" level, a block selecting signal LY1 having a "high" level, column selecting signals UY1 to UY4 having a "high" level are generated, the inverters I5 and I6 generate a pre-charge control signal PRE having a "low" level, and the PMOS transistor P1 is turned on. The NOR gate NOR1 generates a signal having a "high" level, and the NAND gate NA1 generates a write signal WE having a "high" level. The inverters I1, I2, I7 and I8 invert the column selecting signals UY1 to UY4 having a "high" level to generate signals having a "low" level. The NOR gates NOR6 to NOR9 generate signals having a "high" level, and the NOR gates NOR10 to NOR13 generate read control signals re11 to re14 having a "low" level. The NOR gates NOR2 to NOR5 generate write control signals we11 to we14 having a "low" level.

In other words, during a pre-charge operation, the read control signals re11 to re14 having a "low" level and the write control signals we11 to we14 having a "low" level are generated to turn on all of the PMOS transistors of the CMOS transmission gates (C11,C11B) to (C14,C14B) of FIG. 1 but to turn off all of the NMOS transistors. As a result, the bit line pairs (BL11,BL11B) to (BL14,BL14B) and the sense bit line pair (SBL1,SBL1B) are pre-charged to a pre-charge voltage level by the pre-charge circuits 16-11 to 16-14 of FIG. 1, and the PMOS transistor P1 is turned on in response to a pre-charge control signal PRE having a "low" level, whereby the sense bit line pair SBL1,SBL1B is equalized. Even though not described, the other memory cell array blocks perform the same function.

During a write time period T2, when a pre-charge enable signal PEN having a "high" level, a write enable signal WEN having a "high" level, a block selecting signal LY1 having a "high" level, a column selecting signal UY1 having a "high" level, and column selecting signals UY2 to UY4 having a "low" level are generated, the inverters I5 and I6 generate a pre-charge control signal PRE having a "high" level, and the PMOS transistor P1 is turned off. The NOR gate NOR1 generates a signal having a "high" level, and the NAND gate NA1 generates a write signal WE having a "low" level. The inverter I1 inverts a column selecting signal UY1 having a "high" level to generate a signal having a "low" level, and the inverters I2, I7 and I8 invert the column selecting signals UY2 to UY4 having a "low" level to generate signals having a "high" level, respectively. The NOR gates NOR6 to NOR9 generate signals having a "low" level, and the NOR gates NOR10 to NOR13 generate read control signals re11 to re14 having a "high" level. The NOR gate NOR2 generates a write control signal we11 having a "high" level, and the NOR gates NOR3 to NOR5 generate write control signals we12 to we14 having a "low" level.

In other words, during a write operation, the write control signals we12 to we14 having a "low" level and the read control signals re12 to re14 having a "high" level are generated to turn off the COMS transmission gates (C12, C12B) to (C14B,C14) of FIG. 1. Meanwhile, a read control signal re11 having a "high" level and a write control signal we11 having a "high" level are generated to turn off the PMOS transistors, but to turn on the NMOS transistors, of the selected pair of CMOS transmission gates (C11,C11B).

As a result, data transmitted through the write bit line pair (WBL1B,WBL1) are transmitted to the bit line pair (BL11, BL11B) through the NMOS transistors of the CMOS transmission gates (C11,C11B), whereas the data of the bit line pair (BL11,BL11B) are not transmitted to the sense bit line pair (SBL1,SBL1B) through the PMOS transistors of the CMOS transmission gates (C11,C11B). Therefore, a problem such as an increase of power consumption coming from operation of the sense bit line pair (SBL1,SBL1B) during the write operation does not occur.

The pre-charge and write control circuit of FIG. 6 is configured such that all of the PMOS transistors of the CMOS transmission gates are turned on during a pre-charge operation to pre-charge both the bit line pair and the sense bit line pair, and only the NMOS transistors of the selected pair of CMOS transmission gates are turned on, and the PMOS transistor of the selected pair of CMOS transmission gates are turned off during a write operation so that data transmitted to the selected bit line pair may not be transmitted to the sense bit line pair.

As described herein before, the semiconductor memory device according to the present invention turns on only the NMOS transistors of the selected CMOS transmission gates of the column selecting circuit during a write operation, thereby reducing power consumption.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device including a plurality of memory blocks, each of the memory blocks comprising:
   a memory cell array block having a plurality of word lines, a plurality of bit line pairs, and a plurality of memory cells connected between the plurality of word lines and the plurality of bit line pairs;
   a write bit line pair;
   a sense bit line pair;
   a column selecting circuit having a plurality of first transmission transistors for transmitting data between a selected bit line pair among the plurality of the bit line pairs and the write bit line pair in response to a plurality of write control signals, and a plurality of second transmission transistors for transmitting data between the selected bit line pair and the sense bit line pair in response to a plurality of read control signals; and
   a pre-charge and write control circuit for pre-charging and equalizing the sense bit line pair in response to a pre-charge enable signal during a pre-charge operation, generating the plurality of the read control signals in response to a write enable signal and a plurality of column selecting signals during a read operation, and generating the plurality of write control signals in response to a block selecting signal, the write enable signal, the pre-charge enable signal, and the plurality of the column selecting signals during a write operation.

2. The device of claim 1, wherein each of the plurality of the first transmission transistors is an NMOS transistor.

3. The device of claim 1, wherein each of the plurality of the second transmission transistors is a PMOS transistor.

4. The device of claim 1, wherein the pre-charge and write control circuit comprises:
   a pre-charge and equalizing circuit for pre-charging and equalizing the sense bit line pair in response to the pre-charge enable signal;
   a write signal generating circuit for generating a write signal by combining the block selecting signal, the write enable signal and the pre-charge enable signal;
   a read control signal generating circuit for generating the plurality of the read control signals by combining the plurality of the column selecting signals and the write enable signal; and
   a write control signal generating circuit for generating the plurality of the write control signals by combining the plurality of the column selecting signals and the write signal,
   wherein all of the plurality of the first and the second transmission transistors are turned off during a pre-charge operation, and
   wherein selected first transmission transistors among the plurality of the first and the second transmission transistors is turned on during a write operation for transmitting data between the selecting bit line pair and the write bit line pair.

5. A semiconductor memory device including a plurality of memory blocks, each of the memory blocks comprising:
   a memory cell array block having a plurality of word lines, a plurality of bit line pairs, and a plurality of memory cells connected between the plurality of word lines and the plurality of bit line pairs;
   a write bit line pair;
   a sense bit line pair;
   a column selecting circuit having a plurality of first transmission transistors for transmitting data between a selected bit line pair among the plurality of bit line pairs and the write bit line pair in response to a plurality of write control signals, and a plurality of second transmission transistors for transmitting data between the selected bit line pair and the sense bit line pair in response to a plurality of read control signals; and
   a pre-charge and write control circuit for equalizing the sense bit line pair in response to a pre-charge enable signal during a pre-charge operation, generating the plurality of the read control signals in response to a write enable signal, the pre-charge enable signal and a plurality of column selecting signals during a read operation, and generating the plurality of write control signals in response to a block selecting signal, the write enable signal, the pre-charge enable signal, and the plurality of the column selecting signals during a write operation.

6. The device of claim 5, wherein each of the plurality of the first transmission transistors is an NMOS transistor.

7. The device of claim 5, wherein each of the plurality of the second transmission transistors is a PMOS transistor.

8. The device of claim 5, wherein the pre-charge and write control circuit comprises:
   an equalizing circuit for equalizing the sense bit line pair in response to the pre-charge enable signal;
   a write signal generating circuit for generating a write signal by combining the block selecting signal, the write enable signal and the pre-charge enable signal;
   a read control signal generating circuit for generating the plurality of the read control signals by combining the plurality of the column selecting signals, the write enable signal and the pre-charge enable signal; and
   a write control signal generating circuit for generating the plurality of the write control signals by combining the plurality of the column selecting signals and the write signal,
   wherein the plurality of the second transmission transistors are turned on during a pre-charge operation, and
   wherein selected first transmission transistors among the plurality of the first and the second transmission transistors is turned on during a write operation.

9. A semiconductor memory device including a plurality of memory blocks, each of the memory blocks comprising:
   a memory cell array block having a plurality of word lines, a plurality of bit line pairs, and a plurality of memory cells connected between the plurality of word lines and the plurality of bit line pairs;
   a write bit line pair;
   a sense bit line pair;
   a column selecting circuit comprising a plurality of CMOS transmission gates, each CMOS transmission gate including an NMOS transistor connected between one of the bit lines of a bit line pair and one of the sense bit lines of the sense bit line pair, and a PMOS transistor connected between the one bit line and one of the write bit lines of the write bit line pair, the NMOS transistor and the PMOS transistor each having a control terminal; and a pre-charge and write control circuit connected to the plurality of control terminals of the NMOS and PMOS transistors to selectively turn on and turn off the NMOS and PMOS transistors, wherein during a write operation, the pre-charge and write control circuit turns on the NMOS transistors of a selected pair of the CMOS transmission gates, turns off the PMOS tranisistors of the selected pair of the CMOS transmission gates, and turns off the PMOS and NMOS transistors of all of the CMOS transmission gates except the selected pair.

10. The semiconductor memory device of claim 9, wherein during a precharge operation, the pre-charge and write control circuit turns off all of the NMOS transistors and PMOS transistors of all of the CMOS transmission gates.

11. The semiconductor memory device of claim 9, wherein during a precharge operation, the pre-charge and write control circuit turns off all of the NMOS transistors and turns on all of the PMOS transistors of all of the CMOS transmission gates.

* * * * *